United States Patent
Hirabayashi

(10) Patent No.: US 6,978,402 B2
(45) Date of Patent: Dec. 20, 2005

(54) SEMICONDUCTOR MEMORY

(75) Inventor: Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 448 days.

(21) Appl. No.: 10/096,110

(22) Filed: Mar. 13, 2002

(65) Prior Publication Data
US 2002/0170003 A1 Nov. 14, 2002

(30) Foreign Application Priority Data
Mar. 16, 2001 (JP) .................................. P2001-075940

(51) Int. Cl.$^7$ .............................................. G06F 11/00
(52) U.S. Cl. ........................................ 714/42; 714/718
(58) Field of Search .................... 714/42, 718; 365/201

(56) References Cited

U.S. PATENT DOCUMENTS

| | | | | |
|---|---|---|---|---|
| 5,875,153 A | * | 2/1999 | Hii et al. ..................... | 365/233 |
| 5,910,181 A | * | 6/1999 | Hatakenaka et al. ........ | 714/718 |
| 6,058,056 A | * | 5/2000 | Beffa et al. .................. | 365/201 |
| 6,069,829 A | * | 5/2000 | Komai et al. ................ | 365/201 |
| 6,467,053 B1 | * | 10/2002 | Connolly et al. ............. | 714/39 |
| 6,493,647 B1 | * | 12/2002 | Chiang et al. ............... | 702/117 |
| 6,526,533 B1 | * | 2/2003 | Cowles et al. ............... | 714/718 |
| 2003/0070121 A1 | * | 4/2003 | Mori et al. ................... | 714/42 |

* cited by examiner

Primary Examiner—Robert Beausoliel
Assistant Examiner—Yolanda L Wilson
(74) Attorney, Agent, or Firm—Banner & Witcoff, Ltd.

(57) ABSTRACT

A synchronous semiconductor memory operating in synchronization with an external clock signal has (a) a mode selector to select one of a normal mode and a test mode, (b) a clock generator to generate, in the test mode, an internal clock signal whose frequency is higher than the frequency of the external clock signal, (c) an address generator to generate, in the test mode, internal addresses in synchronization with the internal clock signal, the internal clock signal and internal addresses being used in the test mode to carry out a test and provide test result data, and (d) an output data controller to select, in the test mode, part of the test result data and provide the selected part as output data in synchronization with the external clock signal.

11 Claims, 14 Drawing Sheets

SEMICONDUCTOR MEMORY

CROSS REFERENCE TO RELATED APPLICATIONS

This application is based upon and claims the benefit of priority from the prior Japanese Patent Application No. 2001-075940 filed on Mar. 16, 2001, the entire contents of which are incorporated herein by reference.

BACKGROUND OF THE INVENTION

1. Field of the Invention

The present invention relates to a semiconductor memory that is internally operable at high speed when tested with a low-speed tester.

2. Description of the Related Art

Recent high-speed microprocessors require high-speed semiconductor memories, in particular, high-speed static random access memories (SRAMs) serving as cache memories. The high-speed SRAMs require high-speed testers to match the speeds of the SRAMs. High-speed testers, however, are expensive, increasing testing costs.

An earlier technique to deal with this problem installed a built-in self test (BIST) circuit in a memory chip to autonomously carry out high-speed testing in the memory chip. FIG. 1 shows a related art that installs a BIST circuit in a memory chip for carrying out high-speed testing. In FIG. 1, a low-speed tester supplies a low-frequency clock signal CK. From the clock signal CK, a clock generator 201 generates a high-frequency internal clock signal CK_int to carry out high-speed testing of the memory. The low-speed tester provides an address A, a command CMD, and input data D. These data pieces are converted into high-speed ones in synchronization with the internal clock signal CK_int by an input data generator 202, a command generator 203, and an address generator 204 installed in the memory chip. The converted data pieces are supplied to an SRAM core 205 to carry out high-speed testing. After the test, the SRAM core 205 provides a high-frequency test result Q_int. The test result Q_int is compared by a comparator 206 with an expected value generated by an expected value generator 207, and the comparator 206 provides a pass or fail comparison result. The comparison result is compressed by a compressor 208, which provides a low-frequency resultant signal.

The BIST circuit of the related art may carry out high-speed testing with a low-speed tester. The related art, however, provides a test result showing only a final pass or fail result. When a fail result is provided, the related art is unable to provide detailed information such as the fail bit map of the tested memory.

The clock generator 201 in the BIST circuit of the related art employs, for example, a phase-locked loop (PLL) 212 shown in FIG. 2. In a normal mode, a buffer circuit 211 of the clock generator 201 amplifies the external clock signal CK, and a multiplexer (MUX) 213 of the clock generator 201 provides the amplified clock signal as the internal clock signal CK_int. In a test mode, the PLL 212 multiplies the frequency of the external clock signal CK by N in synchronization therewith, and the multiplexer 213 selects the frequency-multiplied clock signal as the internal clock signal CK_int. In this way, the clock generator 201 is capable of generating the high-frequency internal clock signal CK_int from a clock signal provided by a low-speed tester.

The PLL 212 in the clock generator 201, however, needs a large circuit area, and therefore, the BIST circuit incorporating the PLL increases the area of the memory chip in which the BIST circuit is installed.

In this way, the BIST circuit of the related art installed in a semiconductor memory to carry out a test at high speed provides a test result showing only a pass or fail result. Namely, the related art is incapable of providing detailed information related to the test result. In addition, the related art employs a PLL to generate a high-speed clock signal to test the memory at high speed. The PLL increases the size of the BIST circuit, complicates the structure of the same, and is unable to precisely control the frequency of the clock signal generated.

SUMMARY OF THE INVENTION

According to an aspect of the present invention, a synchronous semiconductor memory operating in synchronization with an external clock signal includes (a) a mode selector to select one of a normal mode and a test mode, (b) a clock generator to generate, in the test mode, an internal clock signal whose frequency is higher than the frequency of the external clock signal, (c) an address generator to generate, in the test mode, internal addresses in synchronization with the internal clock signal, the internal clock signal and internal addresses being used in the test mode to carry out a test and provide test result data, and (d) an output data controller to select, in the test mode, part of the test result data and provide the selected part as output data in synchronization with the external clock signal.

DETAILED DESCRIPTION OF EMBODIMENTS

Figure 1:
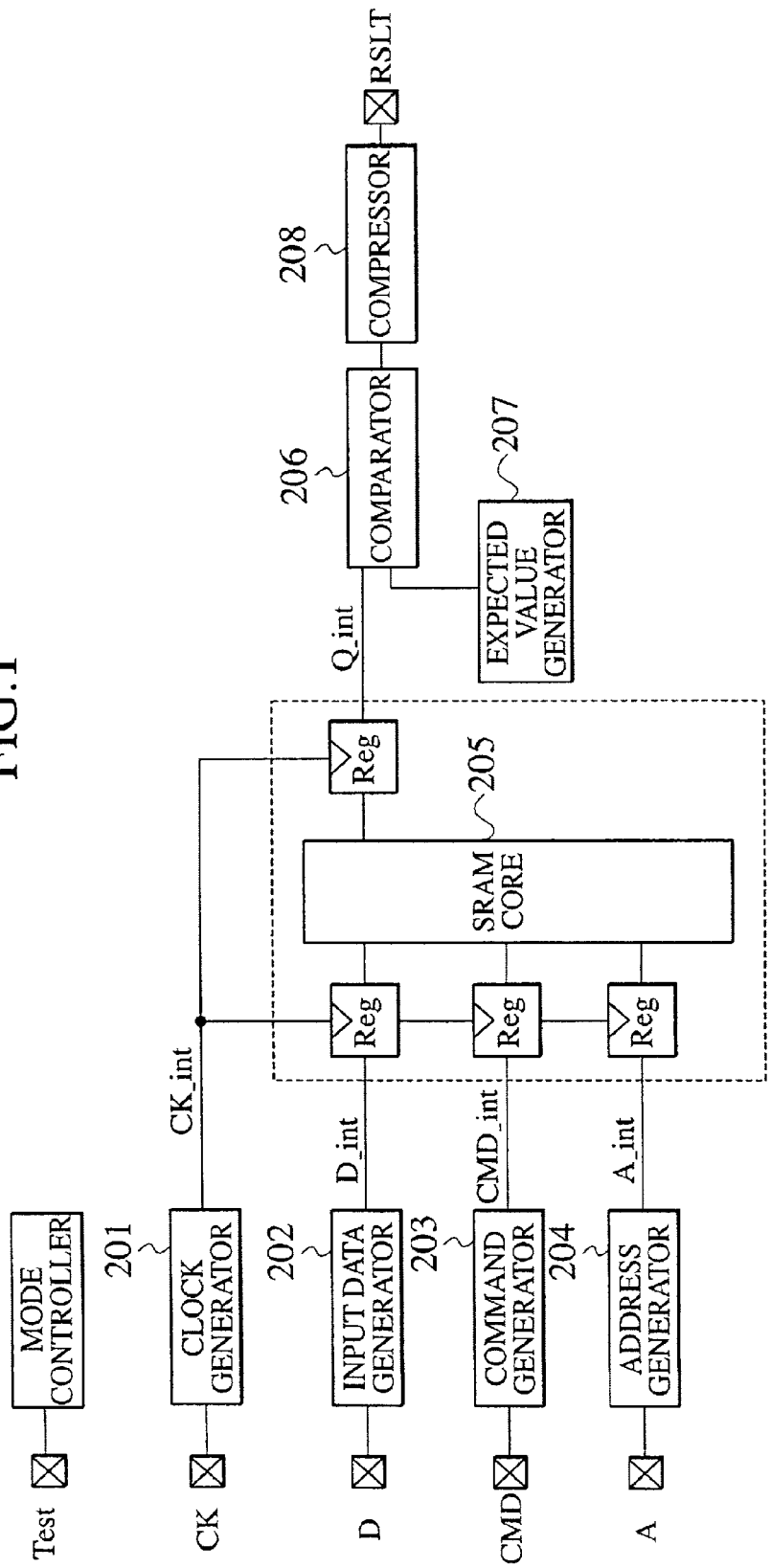
FIG. 1 shows a semiconductor memory having a BIST circuit according to a related art.
Figure 2:
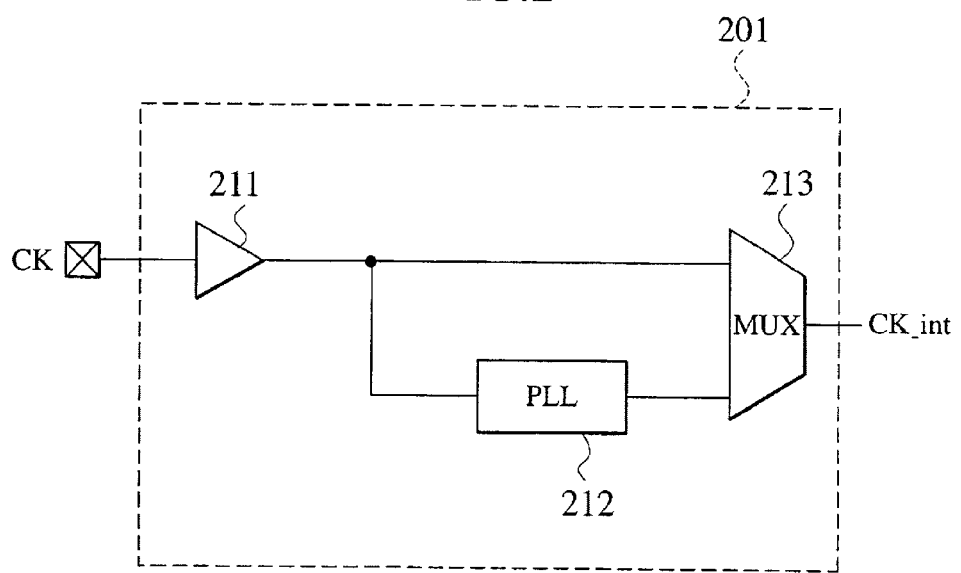
FIG. 2 is a clock generator in the BIST circuit of FIG. 1.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)

Figure 3:
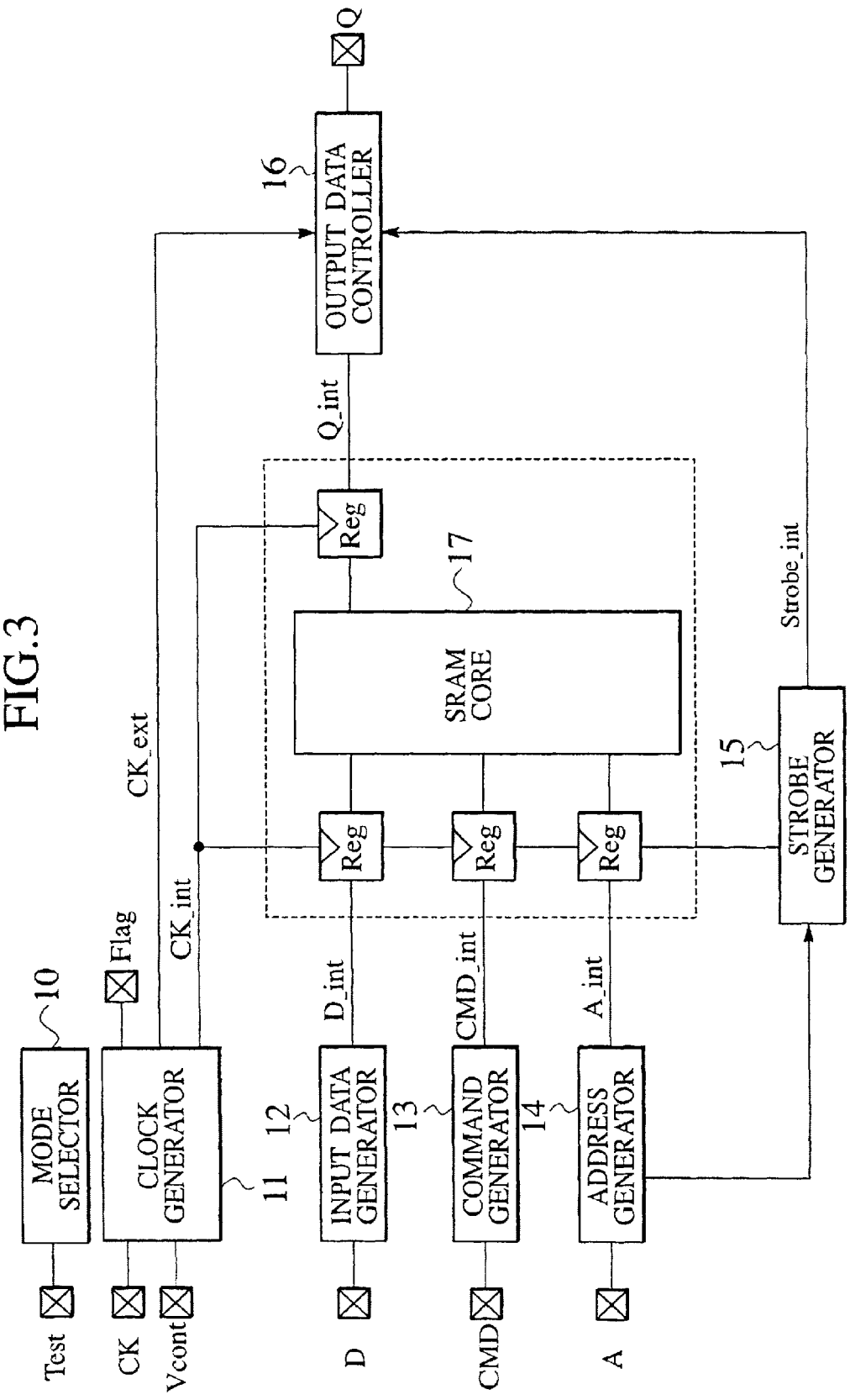
FIG. 3 shows a semiconductor memory according to a first embodiment of the present invention.

As shown in FIG. 3, the memory has a mode selector 10 to select one of a normal mode and a test mode, a clock generator 11, an input data generator 12, a command generator 13, an address generator 14, a strobe generator 15, an output data controller 16, and a SRAM core 17.

Figure 4:
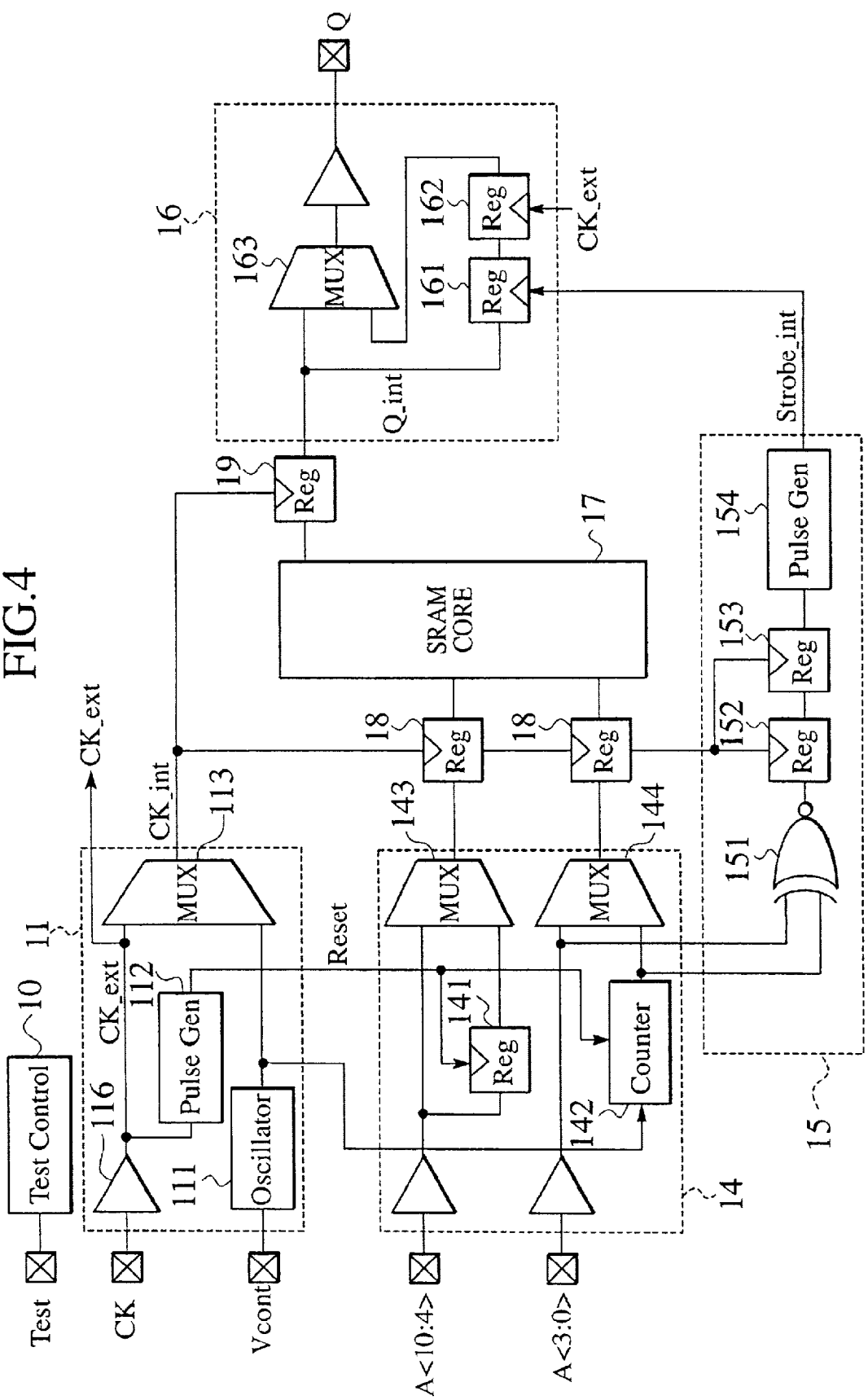
FIG. 4 shows details of the memory of FIG. 3.

FIG. 4 shows details of the clock generator 11, address generator 14, strobe generator 15, output data controller 16, and connections between them in the memory of FIG. 3.

The clock generator 11 has an oscillator 111, a pulse generator 112, a multiplexer 113, and a clock buffer 116. The address generator 14 has a register 141, a counter 142, and multiplexers 143 and 144. The strobe generator 15 has an exclusive NOR gate 151, registers 152 and 153, and a pulse generator 154. The output data controller 16 has registers 161 and 162 and a multiplexer 163.

Figure 5:
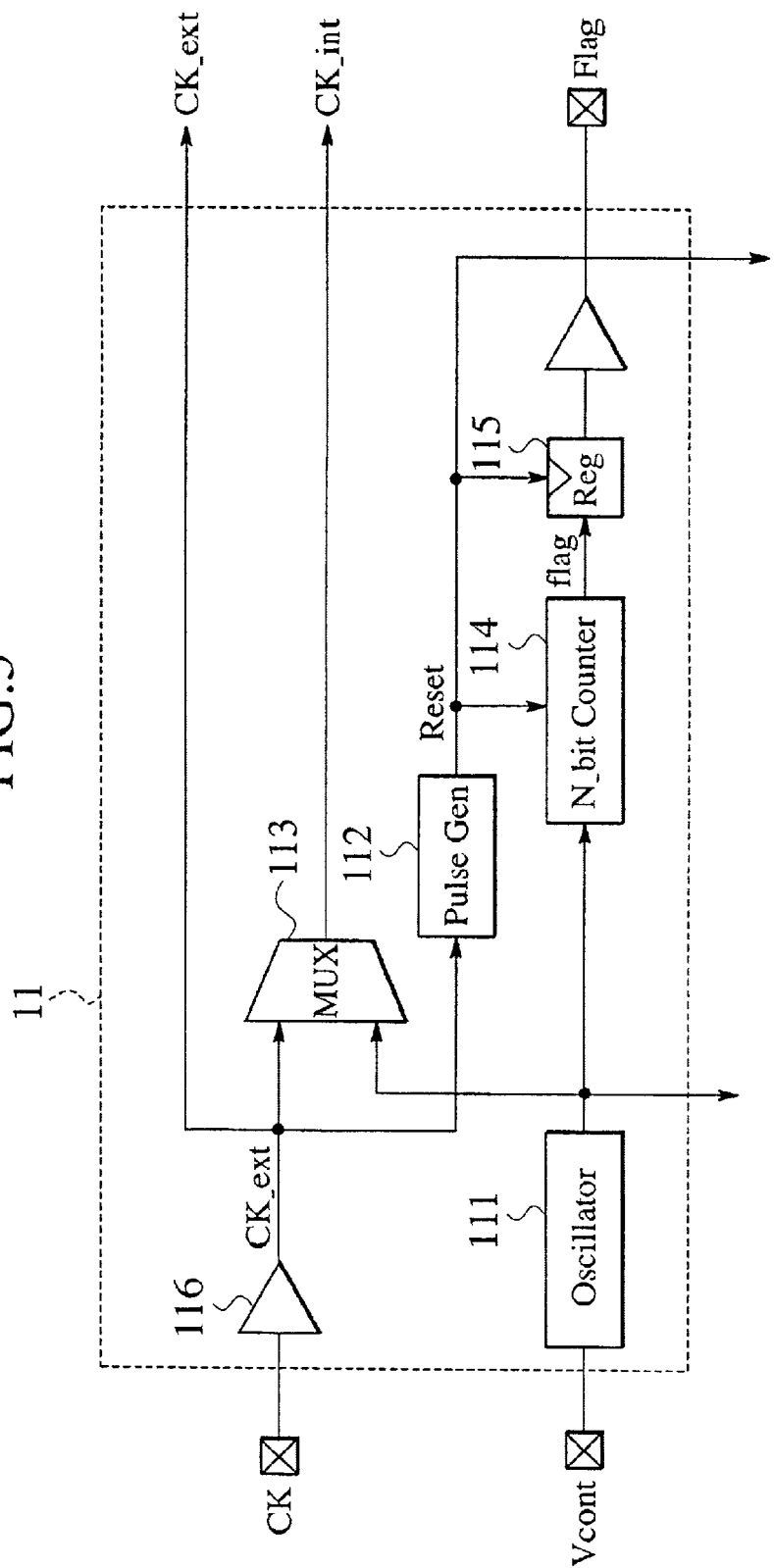
FIG. 5 shows a clock generator in the memory of FIGS. 3 and 4.

As shown in FIG. 5, the clock generator 11 has, as mentioned above, the oscillator 111, pulse generator 112, multiplexer 113, and clock buffer 116. In addition, it has an N-bit counter 114 and a register 115. The clock buffer 116 amplifies an external clock signal CK and provides an amplified external signal CK_ext. The oscillator 111 generates a high-frequency clock signal. The multiplexer 113 selects, as an internal clock signal CK_int, the external clock signal CK_ext or the high-frequency clock signal. In a normal mode, the multiplexer 113 selects the external clock signal CK_ext as the internal clock signal CK_int. In a high-speed test mode, the multiplexer 113 selects the high-frequency clock signal generated by the oscillator 111 as the internal clock signal CK_int.

Figure 6:
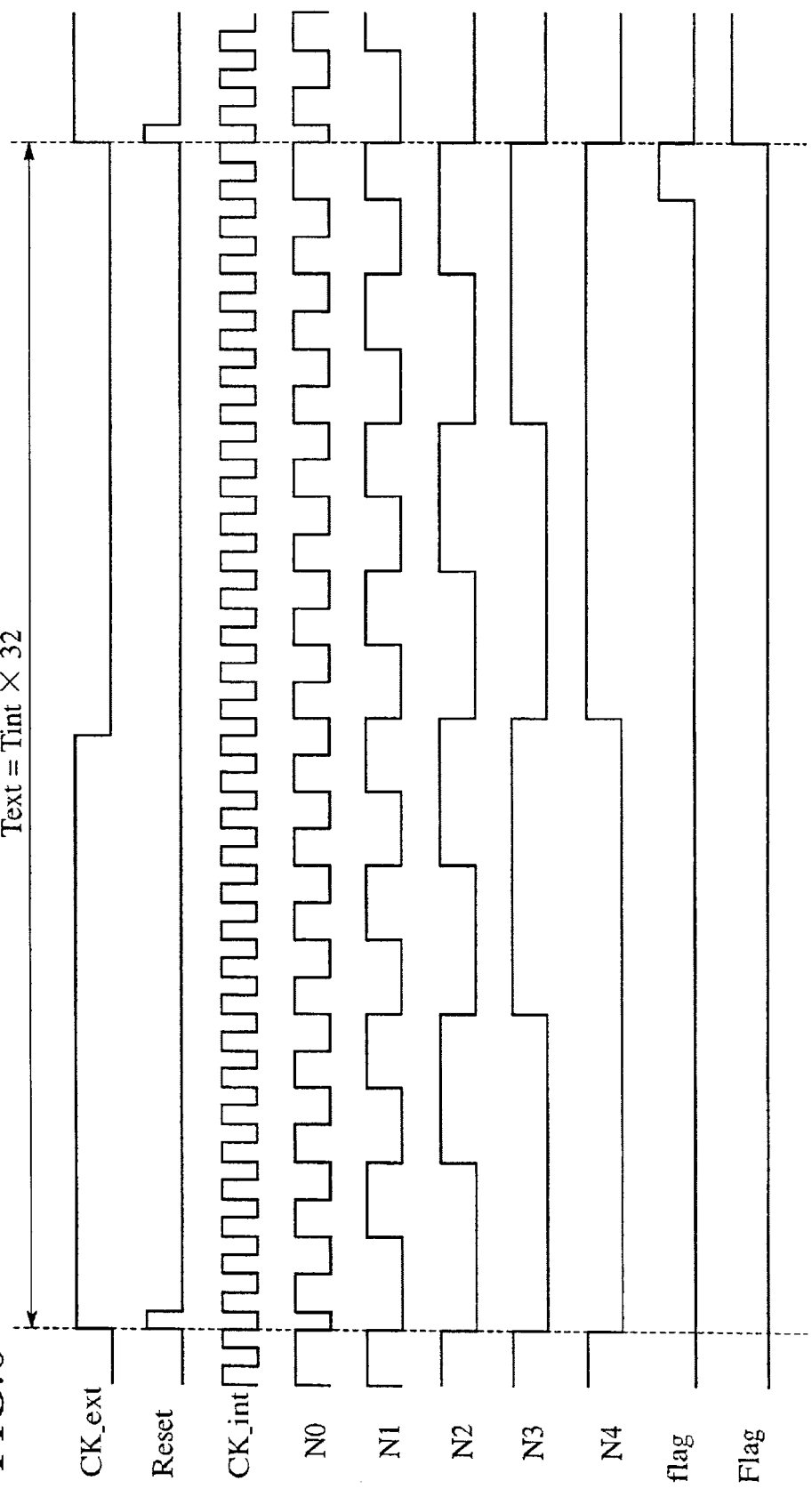
FIG. 6 is a timing chart showing the operation of the clock generator of FIG. 5.

Before starting a high-speed test, the clock generator 11 adjusts the clock frequency. The clock frequency adjustment will be explained with reference to the timing chart of FIG. 6. The oscillator 111 is, for example, a voltage controlled oscillator (VCO) whose oscillation frequency is changed in response to the electric potential level of an externally provided control signal Vcont. The output of the VCO 111 is sent to the N-bit counter 114, which repeats a count-up operation at every clock period. In FIG. 6, N=5. The pulse generator 112 generates a reset pulse at every rise of the external clock signal CK_ext. In response to the reset pulse, the counter 114 resets the count values N0 to N4 to zero. To set an oscillation period at Tint for the VCO 111, a condition of "Text=Tint×2^N" must be established, where Text is the period of the external clock signal CK provided by the low-speed tester. To achieve this, the clock generator 11 stores a flag in the register 115. This flag indicates whether or not the counter 114 has completely counted all "0s" to all "1s" during the period Text. The flag is supplied to the tester through a proper terminal or pad. If the flag detected by the tester is "1" to indicate that a count of 2^N has been counted, the control signal Vcont is adjusted to decrease the oscillation frequency of the VCO 111. If the flag is "0" to indicate that 2^N has not yet been counted, the control signal Vcont is adjusted to increase the oscillation frequency of the VCO 111. Through these operations, the control signal Vcont is adjusted so that the flag comes just between "0" and "1" and the oscillation period Tint is correctly set to 1/(2^N) of the external clock signal period Text.

The clock generator 11 according to the first embodiment employs no PLL circuit of the related art, is simple and small, and correctly generates a high-frequency internal clock signal. The clock generator 11 may have a frequency error in the generated internal clock signal due to jitter in the external clock signal, phase difference between the external and internal clock signals, or the duration for resetting the counter 114. To reduce the frequency error, the number N may be increased. If the external clock signal involves jitter of Δt, the influence of the jitter on the internal clock signal is Δt/(2^N). The low-speed tester usually involves large jitter. In order to reduce jitter in the internal clock signal caused by large jitter in the tester, increasing the number N is effective. After these operations, the control signal Vcont is settled to a proper value for carrying out high-speed testing of the memory.

The address generator 14 will be explained with reference to FIG. 4.

The address generator 14 has the register 141, internal counter 142, and multiplexers 143 and 144. For the sake of convenience, FIG. 4 separates an address into a higher 7-bit address A<10:4> and a lower 4-bit address A<3:0>. Namely, the embodiment forms the higher seven bits of an address from an externally provided address and the lower four bits of the address from data generated by the counter 142.

In the normal mode, the multiplexers 143 and 144 entirely select external address bits and supply them to an input register 18 in response to the internal clock signal CK_int. The address bits in the input register 18 are supplied to the SRAM core 17.

In the test mode, (1) the multiplexer 143 selects as the higher address an external address brought into the register 141 in response to a reset pulse generated by the external clock signal CK_ext;

(2) the multiplexer 144 selects a lower address generated by the counter 142 in response to the clock signal generated by the oscillator 111; and (3) the higher and lower addresses selected by the multiplexers 143 and 144 are transferred to the input register 18 in synchronization with the internal clock signal CK_int. The addresses in the input register 18 are supplied to the SRAM core 17.

The output data controller 16 will be explained with reference to FIG. 4.

The output data controller 16 has the registers 161 and 162 and the multiplexer 163.

In the normal mode, data Q_int from the SRAM core 17 is stored in an output register 19, and the multiplexer 163 selects the data Q_int and provides the same to the outside.

In the test mode, part of data Q_int stored in the output register 19 is transferred to the register 161 in response to an internal strobe signal Strobe_int generated by the strobe generator 15. The data stored in the register 161 is transferred to the register 162 in response to the low-frequency external clock signal CK_ext provided by the low-speed tester. The multiplexer 163 selects the data stored in the register 162 and provides the same to the outside.

The strobe generator 15 will be explained with reference to FIG. 4.

The strobe generator 15 has the exclusive NOR gate 151, registers 152 and 153, and pulse generator 154. In the test mode, (1) the gate 151 compares an externally provided lower address with a lower address generated by the counter 142;

(2) if the addresses agree with each other, the output of the gate 151 is successively stored in the registers 152 and 153 in synchronization with the internal clock signal CK_int and is supplied to the pulse generator 154; and (3) the pulse generator 154 provides an internal strobe signal Strobe_int at the timing when data corresponding to the comparison agreed address is provided from the output register 19.

Figure 7:
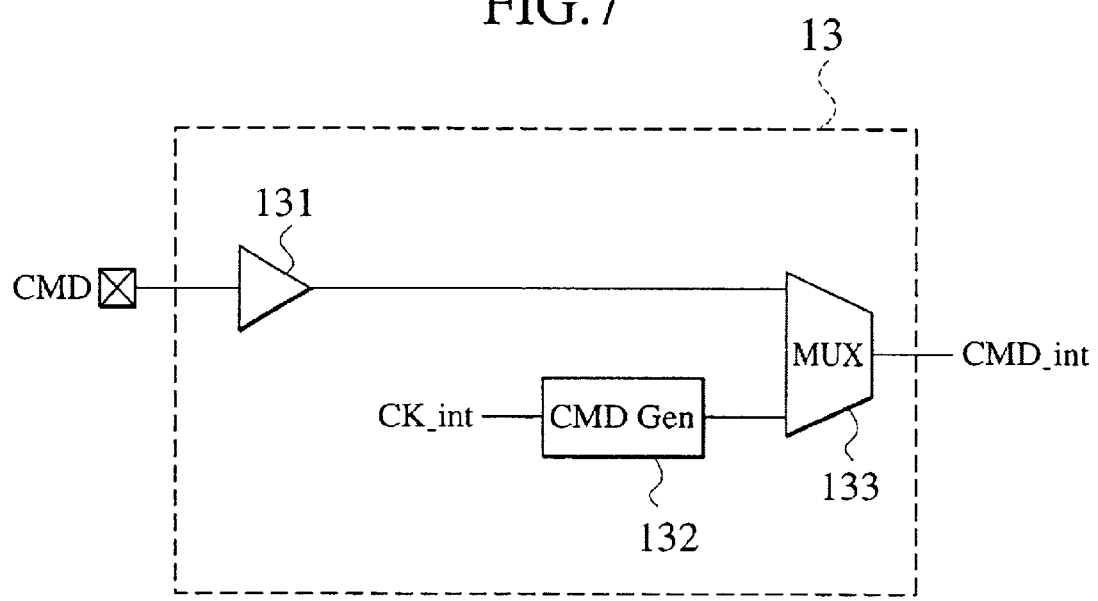
FIG. 7 shows a command generator in the memory of FIG. 3.

The command generator 13 will be explained with reference to FIG. 7.

In the normal mode, (1) a multiplexer 133 of the command generator 13 selects an external command CMD given through a buffer 131 and provides the same as an internal command CMD_int, and in the test mode; and (2) a command generator 132 of the command generator 13 generates a command in synchronization with the internal clock signal CK_int, the generated command being selected by the multiplexer 133 and provided as an internal command CMD_int.

Figure 8:
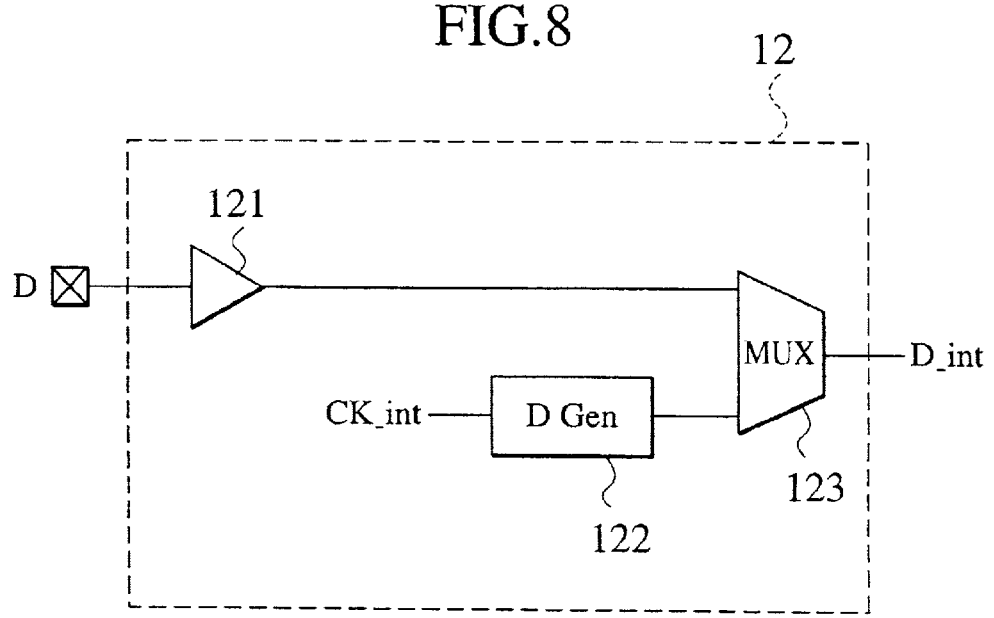
FIG. 8 shows an input data generator in the memory of FIG. 3.

The input data generator 12 will be explained with reference to FIG. 8.

In the normal mode, (1) a multiplexer 123 of the input data generator 12 selects external data D given through a buffer 121 and provides the same as internal input data D_int, and in the test mode; and (2) an input data generator 122 of the input data generator 12 generates input data in synchronization with the internal clock signal CK_int, the generated input data being selected by the multiplexer 123 and provided as internal input data D_int.

Tests of the semiconductor memory having the structure mentioned above will be explained with reference to the timing charts of FIGS. 9 and 10.

Figure 9:
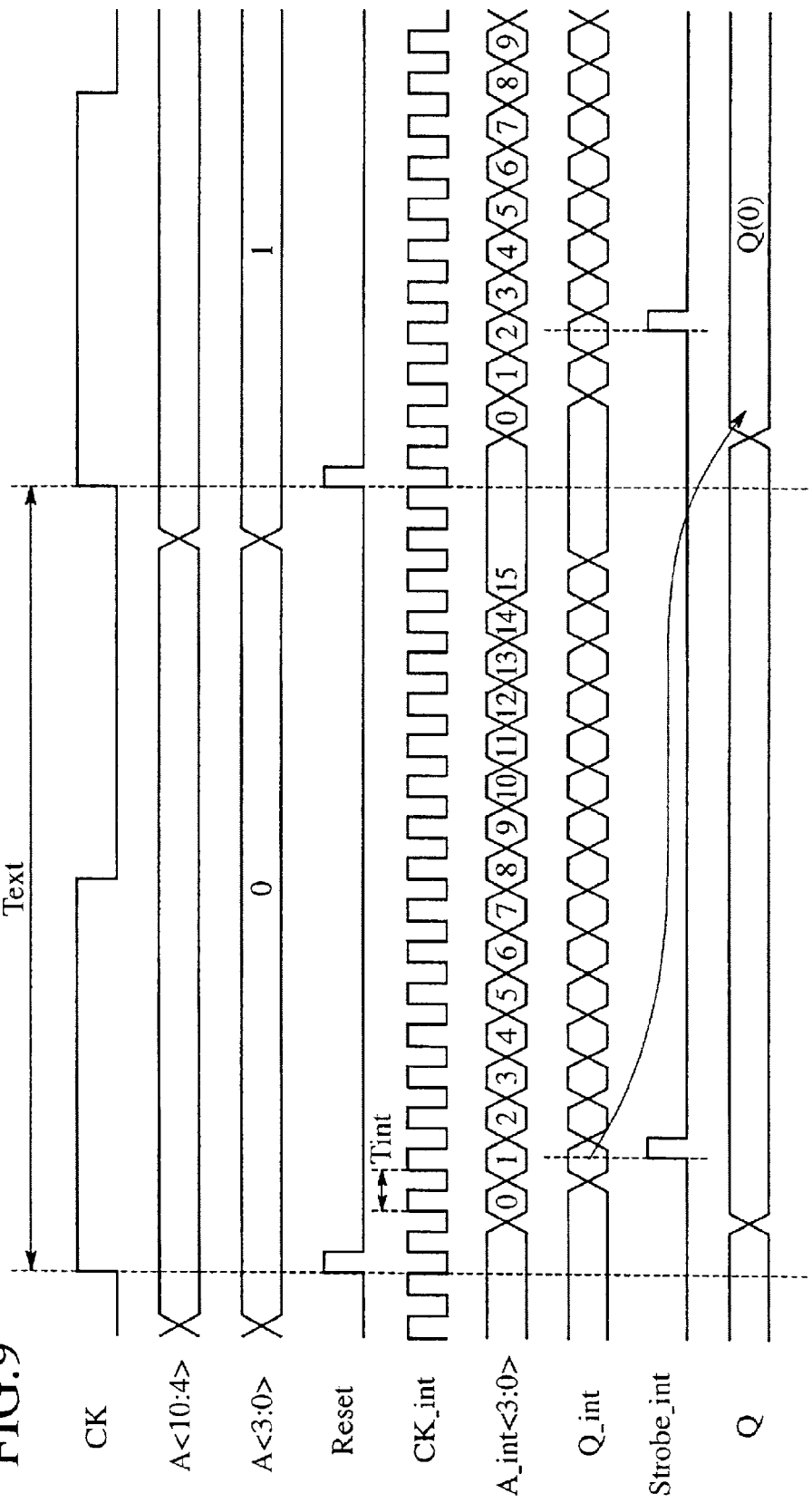
FIG. 9 is a timing chart showing a high-speed test of the memory of FIG. 3.

The test of FIG. 9 is the simplest test to carry out only a high-speed read operation. A command used in the test is fixed to a read command. The test needs no data input, and therefore, no data input is shown in FIG. 9.

A low-speed tester provides the memory with a low-frequency clock signal CK, low frequency addresses A<10:4> and A<3:0>, a command signal, and a data input signal. In the memory, the clock generator 11 generates a high-frequency internal clock signal CK_int. In synchronization with this clock signal, the address generator 14 generates internal addresses A_int<3:0> at high speed. Based on the external address A<10:4> and each M-bit (M=4 in this example) internal address A_int<3:0> generated by the counter 142 at high speed, corresponding data Q_int is read and transferred to the output register 19 at high speed in synchronization with the internal clock signal CK_int. During one period of the external clock signal CK, data pieces corresponding to 2^M addresses are provided sequentially. In response to an internal strobe signal Strobe_int generated by the strobe generator 15, one data piece is selected from the 2^M data pieces Q_int and the selected data piece is stored in the register 161.

The data piece stored in the register 161 is provided to the tester in synchronization with the external clock signal CK_ext.

(1) The strobe generator 15 compares an externally provided lower address with a lower address generated by the counter 142, and if they agree with each other; and (2) The strobe generator 15 generates an internal strobe signal Strobe_int at the timing when data Q_int corresponding to the agreed address is provided. As a result, data corresponding to an external address given at this timing is provided outside in the next period of the external clock signal CK_ext. For the tester, it seems as if the memory is normally operating at low speed in synchronization with the external clock signal. Consequently, the low-speed tester can analyze the test result as in a usual low-speed test and obtain detailed information about the test result.

Figure 10:
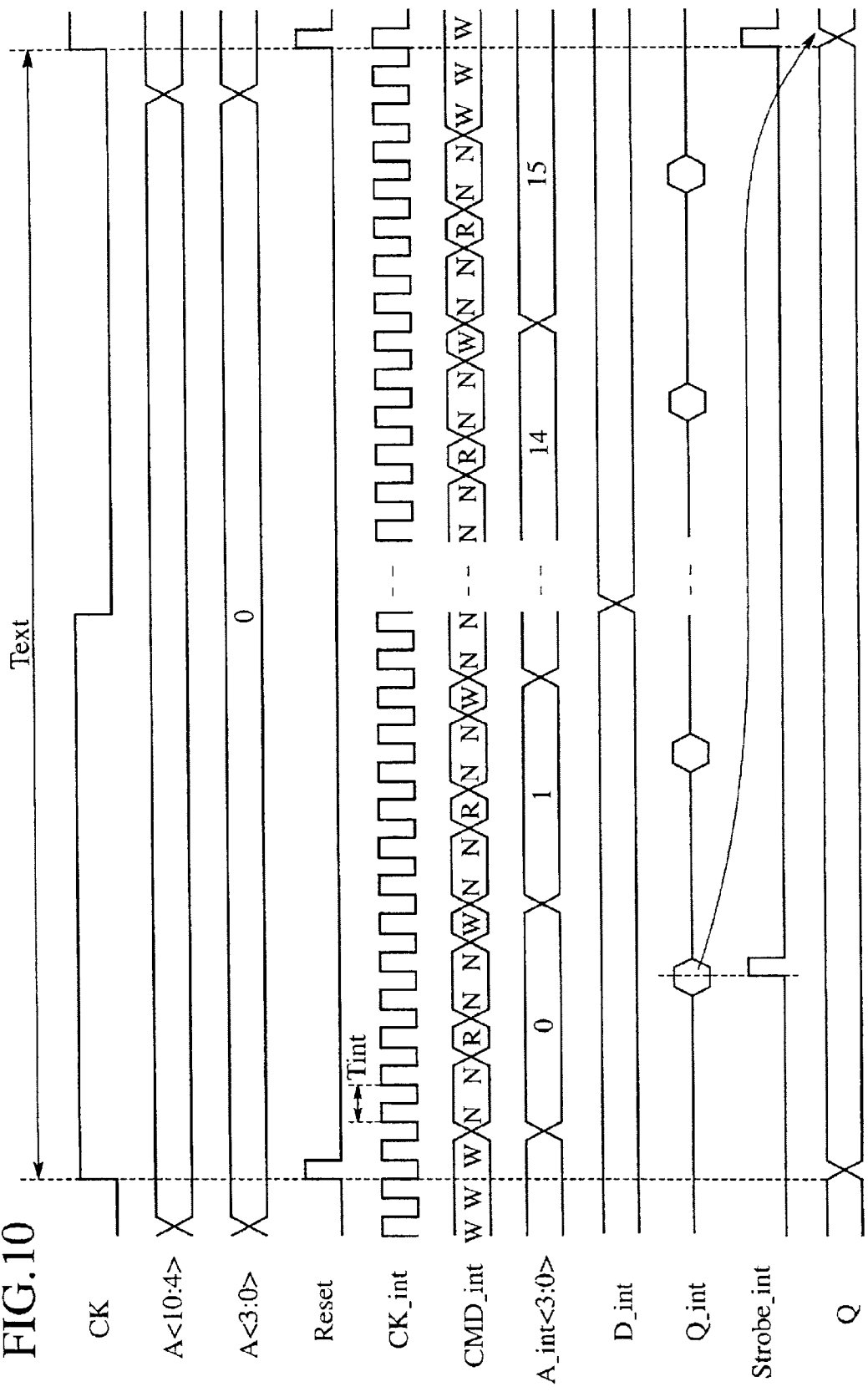
FIG. 10 is a timing chart showing another high-speed test of the memory of FIG. 3.

FIG. 10 is a timing chart showing a more complicated high-speed test carried out in the semiconductor memory of FIG. 3. This test switches between commands at high speed. More precisely, the test is a high-speed march pattern test repeating a read operation (R), non-operation (N), and a write operation (W) while advancing addresses. In this test, (1) the memory provides data Q_int at high speed;

(2) the memory compares an external address with an internal address in the strobe generator 15, and if the addresses agree with each other; and (3) the memory generates an internal strobe signal for data Q_int corresponding to the agreed address. In response to the internal strobe signal, the corresponding data is stored in the register 161. This data is transferred to the external low-speed tester in synchronization with the low-frequency external clock signal CK provided by the tester. For the tester, it seems as if a low-speed read operation is repeated in synchronization with the external clock signal, and therefore, the low-speed tester can analyze the test result in detail.

The first embodiment is capable of employing a low-speed tester to internally operate a memory at high speed. Further, the first embodiment is capable of receiving a test result from the memory at a low frequency at which external addresses are given to the memory from the tester. Namely, for the low-speed tester, it seems as if the memory is operating at a usual low speed, and therefore, the tester can analyze the operation of the memory in detail. The clock generator 11 of the first embodiment is capable of correctly generating an internal clock signal of required high frequency without requiring a synchronizing circuit such as a PLL. The memory according to the first embodiment is small and simple and realizes a small chip area.

(Second Embodiment)

Figure 11:
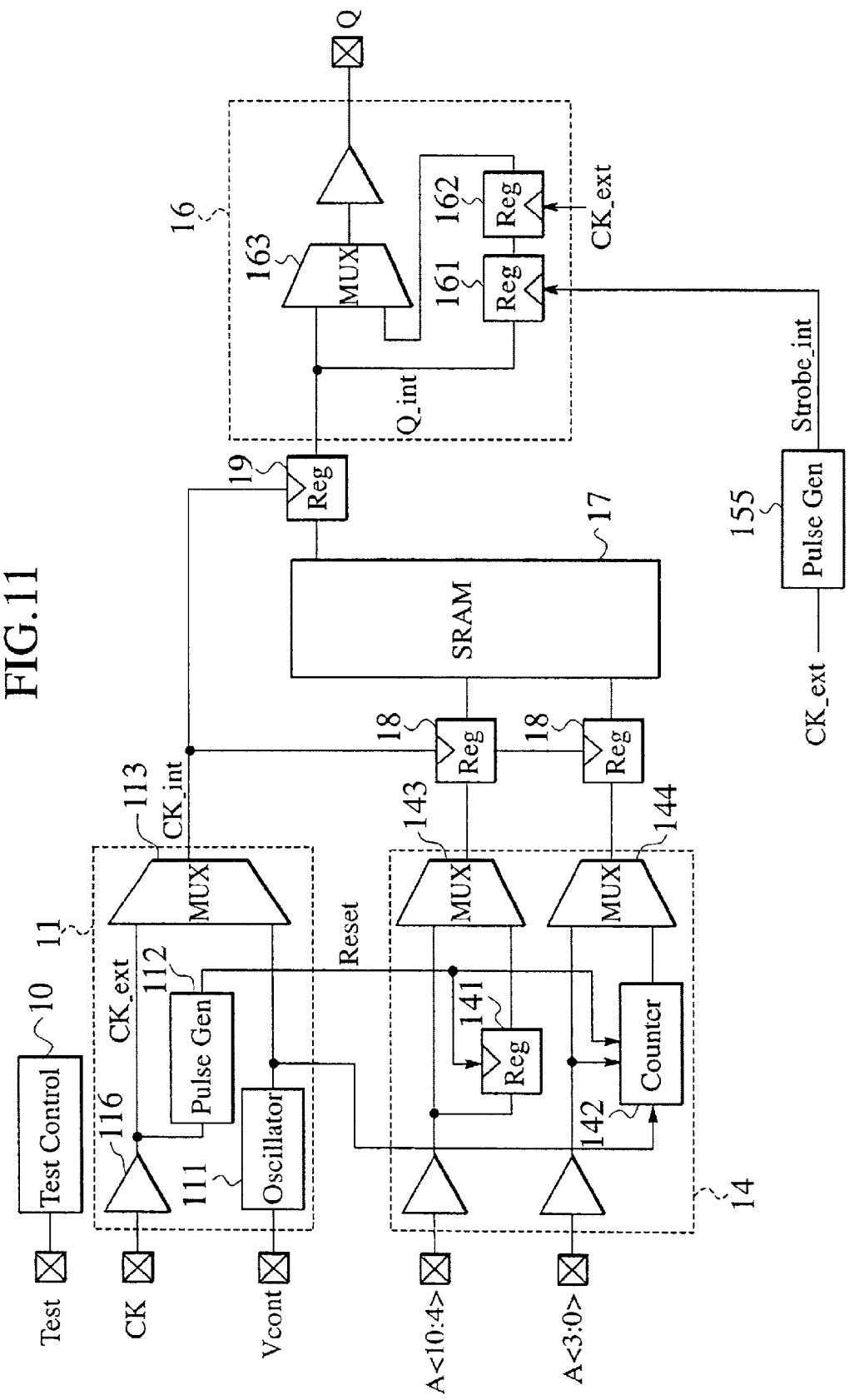
FIG. 11 shows a semiconductor memory according to a second embodiment of the present invention.
Figure 12:
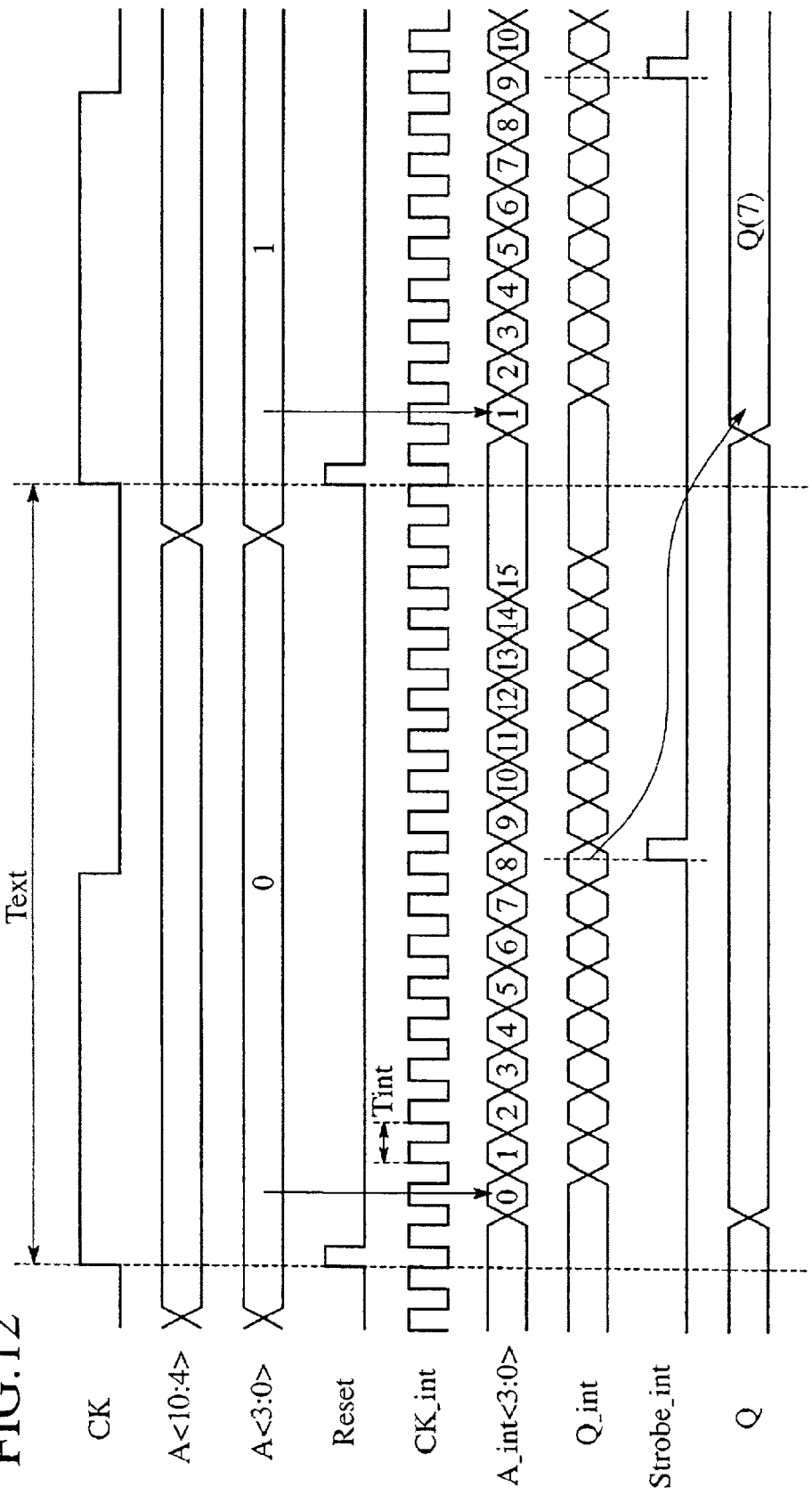
FIG. 12 is a timing chart showing a high-speed test of the memory of FIG. 11.

As shown in FIGS. 11 and 12, according to the second embodiment, the strobe signal generator 15 of FIG. 4 is replaced by a pulse generator 155 to generate an internal strobe signal whose phase is based on a low-frequency external clock signal CK_ext. And a reset operation of an internal counter 142 of an address generator 14 of FIG. 11 sets an external lower address <3:0> as an initial value to generate an internal address A_int<3:0>. When the counter 142 of FIG. 11 is reset, an external lower address <3:0> is brought by the counter 142 as an initial value to generate an internal address A_int<3:0>. Starting from this initial value, the counter 142 counts up.

In FIG. 12, the pulse generator 155 is adjusted to generate an internal strobe signal at the position of data Q_int corresponding to the eighth address A_int<3:0> counted from an initial value "0" set in the counter 142. If a given external lower address <3:0> is "0," an initial value for an internal address A_int<3:0> is "0," and therefore, data corresponding to the eighth address is Q(7). If the external lower address <3:0> is "1," an initial value for an internal address A_int<3:0> is "1," and therefore, data corresponding to the eighth address is Q(8). Even if the output timing of the internal strobe signal Strobe_int is fixed, an initial value for an internal address A_int<3:0> is changed to store proper data in a register 161.

The timing for generating the internal strobe signal is optional. For example, it may be generated at the timing of data corresponding to the second address or the fourth address counted from an initial internal address A_int<3:0> of "0."

Like the first embodiment, the second embodiment is capable of correctly controlling the order of data received by a tester so that the tester may analyze a test result in detail for an entire address space of a target memory.

(Third Embodiment)

Figure 13:
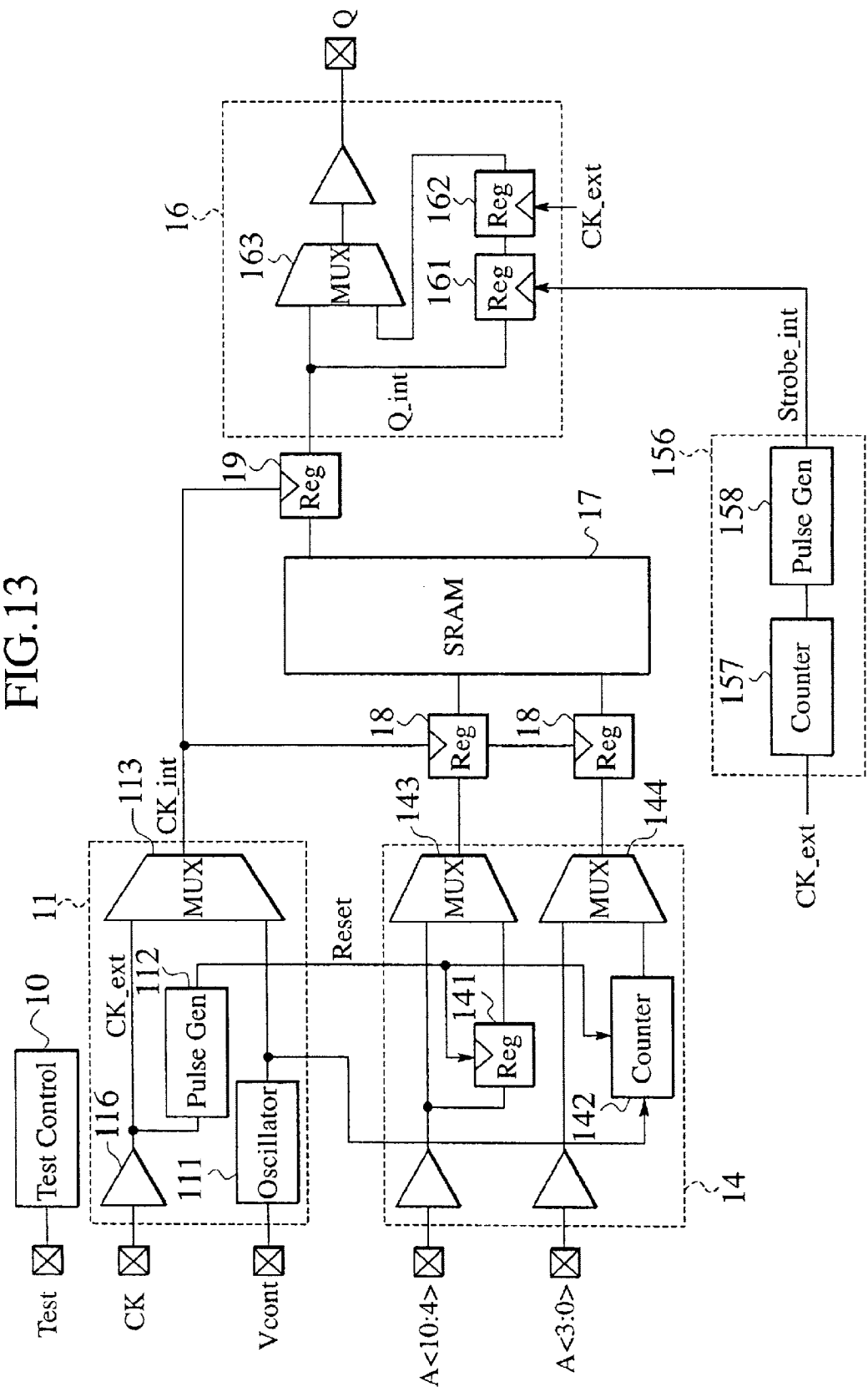
FIG. 13 shows a semiconductor memory according to a third embodiment of the present invention.

As shown in FIG. 13, the third embodiment replaces the strobe signal generator 15 of FIG. 4 with a strobe signal generator 156. The strobe signal generator 156 has a counter 157 to carry out a counting operation in synchronization with an external clock signal CK_ext and a pulse generator 158 to generate a strobe signal according to a count value of the counter 157.

Figure 14:
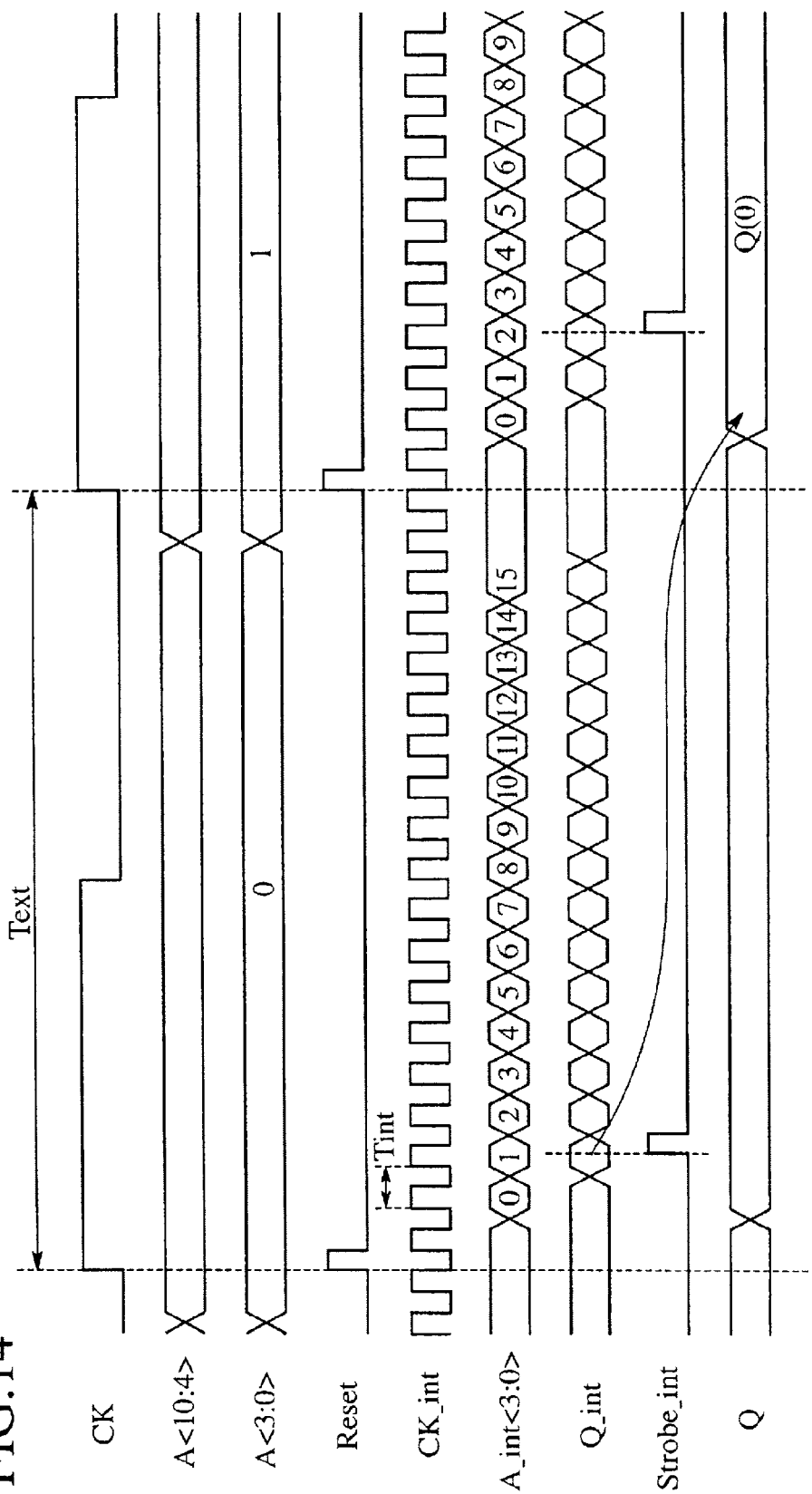
FIG. 14 is a timing chart showing a high-speed test of the memory of FIG. 13.

In FIG. 14, the counter 157 is a 4-bit counter. For example, if the counter 157 has a count value of "0000," an internal strobe signal Strobe_int is provided for data Q_int corresponding to an internal lower address A_int<3:0> of "0". If the counter 157 has a count value of "0001," the internal strobe signal Strobe_int is provided for data Q_int corresponding to an internal lower address A_int<3:0> of "1". And, if the counter 157 has a count value of "1111," the internal strobe signal Strobe_int is provided for data Q_int corresponding to an internal lower address A_int<3:0> of "15." In this way, a count value of the counter 157 is changed in synchronization with the external clock signal, and in response to the count value, the output timing of the internal strobe signal Strobe_int is changed to change data fetched into a register 161.

The third embodiment provides the same effectiveness as the second embodiment of FIGS. 11 and 12.

As explained above, the semiconductor memory according to any one of the embodiments of the present invention is capable of operating at high speed even with a low-speed tester and provides a test result corresponding to an external address supplied at a low frequency. For the low-speed tester, it seems as if the semiconductor memory is carrying out a usual low-speed operation, so that the low-speed tester can provide detailed information such as the fail bit map.

The clock generator provided for the semiconductor memory according to any one of the embodiments of the present invention is capable of correctly generating an internal clock signal of a required frequency without need for a synchronizing circuit such as a PLL. The clock generator is small and simple to minimize the chip area of the semiconductor memory.

Although the present invention has been described in terms of various embodiments, it is not intended that the invention be limited to these embodiments. Modification within the spirit of the invention will be apparent to those skilled in the art. SRAMs to be tested include pipelined burst SRAM (PBSRAM). Memories to be tested are not limited to SRAM. For example, dynamic random access memory (DRAM), synchronous DRAM (SDRAM), double data rate SDRAM (DDR SDRAM) and rambus DRAM (RDRAM) may be tested.

Figure 15:
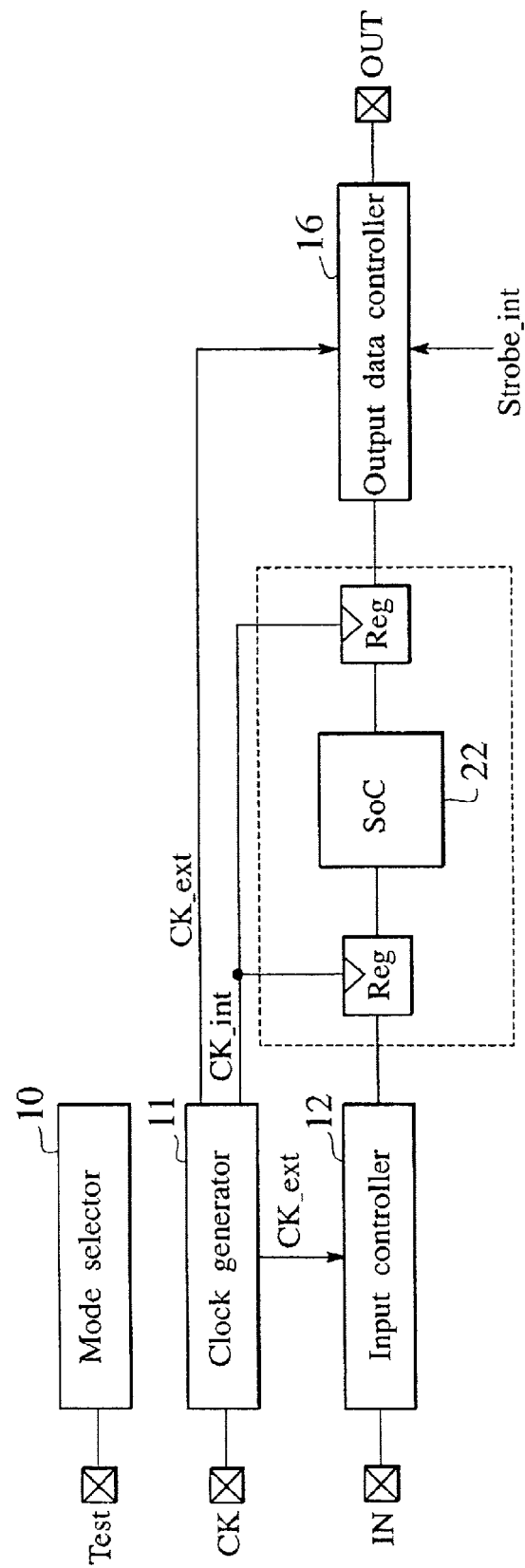
FIG. 15 shows an illustrative system on chip device according to an embodiment of the present invention.

The present invention is applicable not only to memory devices but also to general SoC (system on chip) devices, to achieve operation tests at high speed in the SoC devices. FIG. 15 shows an example of an SoC device according to an embodiment of the present invention. In the SoC device 22 of FIG. 15, input data from a low-speed tester is stored in an input controller 12 in synchronization with a tester clock signal or an external clock signal. The stored input data is supplied to the SoC device 22 in synchronization with a high-speed internal clock signal, and the SoC device 22 provides test result data in synchronization with the high-speed internal clock signal. Part of the test result data is selected by an output data controller 16 and is provided as output data in synchronization with the external clock signal.

What is claimed is:

1. A synchronous semiconductor memory operating in synchronization with an external clock signal, comprising:
    a mode selector configured to select one of a normal mode and a test mode;
    a clock generator configured to generate, in the test mode, an internal clock signal whose frequency is higher than the frequency of the external clock signal;
    an address generator configured to communicate with the clock generator and to generate, in the test mode, internal addresses in synchronization with the internal clock signal, the internal clock signal and internal addresses being used in the test mode; and
    an output data controller configured to communicate with the clock generator, in the test mode, to receive data in synchronization with the internal clock signal, to select part of the data and to provide the selected part of the data as output data in synchronization with the external clock signal.

2. The semiconductor memory of claim 1, further comprising:
    a strobe generator configured to generate a strobe signal at given timing,
    wherein the output data controller is configured to select part of the data in synchronization with the strobe signal and to provide the selected part of the data as output data in synchronization with the external clock signal.

3. The semiconductor memory of claim 2, wherein the output data controller includes:
    a first register configured to communicate with the strobe generator, to receive data in synchronization with the internal clock signal, to fetch and to hold part of the data in synchronization with the strobe signal; and
    a second register configured to communicate with the clock generator, to fetch and to hold the data held in the first register in synchronization with the external clock signal.

4. The semiconductor memory of claim 2, wherein the strobe generator includes:
    a coincidence circuit configured to communicate with an address port and the address generator, to compare an externally provided address with an internal address generated by the address generator and to provide a coincidence result of "1" or "0" to indicate whether or not the compared addresses agree with each other; and
    a pulse generator configured to communicate with the coincidence circuit and to generate a strobe signal at the timing when data corresponding to a coincided address is entered into the output data controller.

5. The semiconductor memory of claim 2, wherein:
    the strobe generator includes a pulse generator configured to communicate with the clock generator and to generate a strobe signal having a given phase shift relative to the phase of the external clock signal; and
    the address generator employs part of an externally provided address as an initial value based on which the address generator generates an internal address.

6. The semiconductor memory of claim 2, wherein the strobe generator includes:
    a counter configured to carry out a counting operation in synchronization with the external clock signal; and a pulse generator to generate a strobe signal based on a value counted by the counter.

7. The semiconductor memory of claim 1, wherein the clock generator includes:
   an oscillator configured to generate the internal clock signal, the oscillation frequency of the oscillator being variably adjusted according to an externally provided control signal;
   a counter configured to communicate with the oscillator, to be reset in synchronization with the external clock signal, to carry out a counting operation according to the internal clock signal, and to generate a flag at a set count value; and
   a register configured to communicate with the counter, to fetch and to hold the flag in synchronization with the external clock signal.

8. The semiconductor memory of claim 1, wherein the address generator includes:
   a register configured to hold a predetermined number of higher bits of an externally provided address in synchronization with a reset pulse generated from the external clock signal; and
   an internal counter configured to communicate with the clock generator and to generate lower bits of an address in synchronization with the internal clock signal, the number of the lower bits being equal to the difference between the total number of bits of the address and the predetermined number of higher bits.

9. The semiconductor memory of claim 1, further comprising:
   an input data generator configured to communicate with the clock generator and to generate input data in synchronization with the internal clock signal.

10. The semiconductor memory of claim 1, further comprising:
    a command generator configured to communicate with the clock generator and to generate a command in synchronization with the internal clock signal.

11. A synchronous semiconductor device operating in synchronization with an external clock signal, comprising:
    a mode selector configured to select one of a normal mode and a test mode;
    a clock generator configured to generate, in the test mode, an internal clock signal whose frequency is higher than the frequency of the external clock signal; and
    an output data controller configured to communicate with the clock generator, in the test mode, to receive data in synchronization with the internal clock signal, to select part of the data and to provide the selected part of the data as output data in synchronization with the external clock signal.

* * * * *